United States Patent [19]
Desai et al.

[11] Patent Number: 5,164,624
[45] Date of Patent: Nov. 17, 1992

[54] MODULAR POWER SEMICONDUCTOR ASSEMBLY FOR AN ALTERNATOR-FED DC POWER SOURCE

[75] Inventors: Prakash H. Desai, Downers Grove; Robert W. Becker, Warrenville; Roger M. Boor, Lisle; John E. Carter, La Grange, all of Ill.

[73] Assignee: General Motors Corporation, Detroit, Mich.

[21] Appl. No.: 754,982

[22] Filed: Sep. 6, 1991

[51] Int. Cl.$^5$ .................... H01L 23/32; H05K 7/20
[52] U.S. Cl. .................. 310/68 D; 361/386; 357/81; 363/141
[58] Field of Search ............. 310/68 R, 68 A, 68 D; 363/141, 145; 357/76, 81; 174/16.3; 165/80.3, 185; 307/71, 115; 361/379, 383–389

[56]  References Cited
  U.S. PATENT DOCUMENTS

| | | | |
|---|---|---|---|
| 3,340,413 | 9/1967 | Drabik | 310/68 |
| 3,340,448 | 9/1967 | Thiessen | 318/140 |
| 4,009,431 | 2/1977 | Johnson | 322/7 |
| 4,583,005 | 4/1986 | Bevans | 307/115 |
| 4,628,219 | 12/1986 | Troscinski | 310/68 D |
| 4,745,315 | 5/1988 | Terry et al. | 310/68 |
| 4,896,062 | 1/1990 | Polland | 310/68 D |
| 4,943,890 | 7/1990 | Schaltenbrand | 361/388 |
| 4,992,925 | 2/1991 | Meyer | 363/141 |

Primary Examiner—Gerald P. Tolin
Attorney, Agent, or Firm—Mark A. Navarre

[57]  ABSTRACT

A power semiconductor bridge assembly for an alternator-fed DC power source, including positive and negative parallel spaced DC bus bars and a plurality of disk device phase modules disposed therebetween for interconnecting the bus bars with the alternator phase windings. The modules are mounted within the bus bars so as to facilitate their installation and removal. Each phase module includes a pair of disk-type power semiconductor devices separated by an inner heat sink which is connected to a motor phase winding, and sandwiched between first and second outer heat sinks. The semiconductor devices and various heat sinks are aligned along a mutual longitudinal axis which substantially coincides with a longitudinal axis of the bus bar cavity. The outer heat sinks are staggered or offset along a transverse axis of the cavity such that the first outer heat sink engages the positive DC bus bar, and the second outer heat sink engages the negative DC bus bar. Guide members formed on inner surfaces of the bus bars support the phase modules prior to their connection to the bus bars.

9 Claims, 5 Drawing Sheets 5,164,624

MODULAR POWER SEMICONDUCTOR ASSEMBLY FOR AN ALTERNATOR-FED DC POWER SOURCE

This invention is directed to a high current power semiconductor bridge assembly of the type used in a locomotive traction motor drive, and more particularly, to a modularized arrangement utilizing disk type power semiconductor devices.

BACKGROUND OF THE INVENTION

In most locomotive traction motor drive systems, the AC output of an engine driven alternator is converted to DC by a full wave power semiconductor bridge assembly to provide a DC supply voltage for energizing the windings of one or more AC or DC traction motors. The rectifier assembly typically includes a relatively large number of power semiconductor devices, and may be conveniently housed within a chamber integral with the housing of the alternator. In this way, the ventilating air provided to cool the alternator may be used to cool the power semiconductor devices as well. Such an arrangement is set forth in principle in U.S. Pat. No. 3,340,413 to Drabik, issued Sep. 5, 1967, and assigned to the assignee of the present invention.

Whether housed at the alternator or at a remote location, the conventional practice in constructing power semiconductor bridge assemblies is to individually mount a number of stud-mount power semiconductor devices in parallel on two or more electrical bus bars, and to electrically interconnect the free current carrying terminals of the devices with the phase windings of the alternator to form a full wave bridge; see the above referenced patent to Drabik. A drawback of this type of arrangement is that removal and replacement of a failed power semiconductor device may be relatively difficult and time consuming. Another drawback is that paralleling hardware and voltage drop matched devices are required.

More recently, there have been efforts to utilize higher current capacity power semiconductors in a disk-type package to minimize the number of devices, essentially to that required by the circuit topology. This also simplifies assembly and maintenance procedures, while improving reliability and controllability.

SUMMARY OF THE PRESENT INVENTION

The present invention is directed to an improved power semiconductor assembly for an alternator-fed DC power source, including positive and negative parallel spaced DC bus bars, and a plurality of disk device modules disposed therebetween for interconnecting the bus bars with the alternator phase windings. The modules are mounted within the bus bars so as to facilitate their installation and removal.

The bus bars define a cavity having longitudinal and transverse axes, and each phase module includes a pair of disk-type power semiconductor devices separated by an inner heat sink which is connected to a motor phase winding, and sandwiched between first and second outer heat sinks. The semiconductor devices and various heat sinks are aligned along a mutual longitudinal axis which substantially coincides with a longitudinal axis of the bus bar cavity.

The outer heat sinks are staggered or offset along a transverse axis of the cavity, such that the first outer heat sink engages the positive DC bus bar and the second outer heat sink engages the negative DC bus bar. Once in place, the first outer heat sink is fastened to the positive bus bar and the second outer heat sink is fastened to the negative bus bar, completing the electrical connections of the phase module. Guide members formed on inner surfaces of the bus bars support the phase modules prior to their connection to the bus bars and ensure that clearance and creep distance requirements between the modules are satisfied.

In the illustrated embodiment, the above-described arrangement is utilized in connection with a transition alternator having multiple sets of electrically isolated polyphase windings, separately rectified to form two DC sources which are selectively connected in series or parallel. One such arrangement is shown in U.S. Pat. No. 4,009,431 to Johnson, issued Feb. 22, 1977, and assigned to the assignee of the present invention. This type of machine requires the inclusion of transition modules and a switch for suitably interconnecting the two sets of positive and negative bus bars.

The transition module includes a disk-type power semiconductor device having a longitudinal axis which substantially coincides with the longitudinal axes of the phase modules. The transition device is sandwiched between a pair of heat sinks which are staggered or offset along a transverse axis of the cavity so that only one of the heat sinks engages an inner longitudinal surface of a bus bar. A jumper cable connected to the other heat sink links the transition device to a like polarity bus of the bridge for the other winding set. The heat sink engaging the bus bar is then fastened to the bus bar to complete the electrical and mechanical connections. As with the phase rectifier modules, guide members are provided to support the transition modules and to ensure that clearance and creep distance requirements are satisfied.

According to a second embodiment of this invention, the phase and transition modules are each supported by a pair of insulator blocks secured to inner surfaces of the positive and negative bus bars. Where required, electrical contact between the heat sinks and bus bars is made via connecting bolts. With this arrangement, the staggered relationship of the outer heat sinks is achieved with the insulating blocks, permitting increased uniformity in the manufacture of the heat sinks.

The modular power semiconductor assembly of this invention may also be used in connection with a multiple winding set alternator in which multiple disk-type thyristor converters are employed to develop separate variable voltage DC sources. In this case, the converters may be connected in series or parallel by bus bars or jumper cables. A further application of the modular power semiconductor assembly of this invention is in connection with an AC machine being operated as a motor, for example, to crank the engine of a diesel-electric locomotive.

DETAILED DESCRIPTION OF THE DRAWINGS

Figure 1:
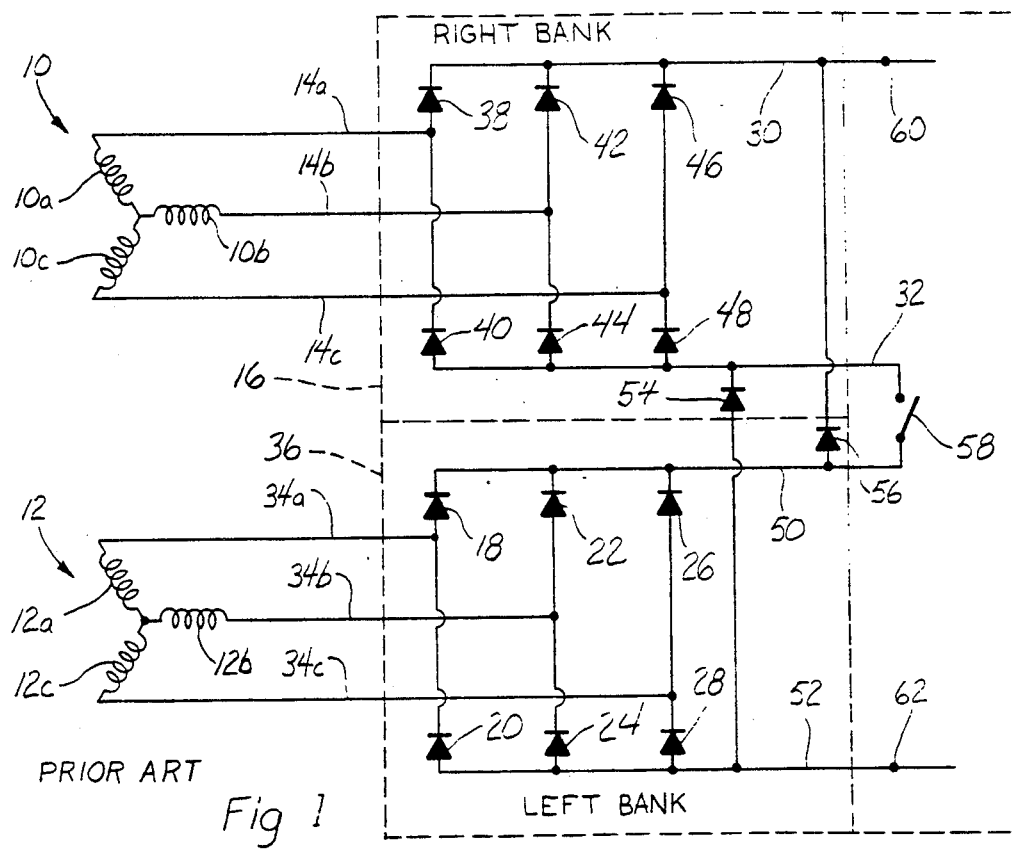
FIG. 1 is a schematic circuit diagram of a known transition alternator, bridge rectifier and transition hardware arrangement.

Referring to the transition alternator circuit diagram of FIG. 1, the reference numerals 10 and 12 generally designate first and second sets of WYE-connected three-phase stator windings. The individual windings 10a-10c and 12a-12c each comprise several winding elements connected in parallel, all of the winding elements being distributed within the stator core of a single engine-driven machine.

The first winding set 10 develops three-phase AC voltages on lines 14a-14c, and the full-wave bridge circuit 16 comprising the individual power semiconductor devices 38-48 converts such voltages to a DC supply voltage which appears across positive and negative DC rails designated by the reference numerals 30 and 32.

The second winding set 12 develops three-phase AC voltages on lines 34a-34c, and the full-wave circuit 36 comprising the individual power semiconductor devices 18-28 converts such voltages to a DC supply voltage which appears across positive and negative DC rails designated by the reference numerals 50 and 52.

The first and second bridge circuits 16 and 36 are interconnected by a pair of transition power semiconductor devices 54 and 56 and an electrically controlled switch 58 to define a single alternator output at output terminals 60 and 62 formed on positive and negative rails 30 and 52, respectively. The transition devices 54 and 56 electrically couple the negative and positive DC rails 32, 52 and 30, 50, while the switch 58 selectively couples the positive rail 50 of bridge circuit 36 to the negative rail 32 of bridge circuit 16.

When the switch 58 is open, as shown in FIG. 1, the transition devices 54 and 56 effectively connect the bridge circuits 16 and 36 in parallel to provide a high current/low voltage capability at output terminals 60, 62. When the switch 58 is closed, the bridge circuits 16 and 36 are connected in series, reverse biasing the transition devices 54 and 56. This arrangement provides a low current/high voltage capability at output terminals 60, 62.

In most applications, and as illustrated in the drawings, the power semiconductor devices are simple, two-terminal diode rectifiers. In other applications, however, gate controlled devices such as silicon controlled rectifiers, or gate-turn-off devices, for example, may be employed. The modular assembly of the present invention is applicable to both, and to any bridge comprising power semiconductor devices having two main current carrying terminals.

In the illustrated embodiment, the power semiconductor devices 38-48 of bridge circuit 16 and the transition device 54 are situated on the right-hand side of the alternator air box as viewed in FIG. 7, and are collectively referred to herein as the RIGHT BANK. The power semiconductor devices 18-28 of bridge circuit 36 and transition device 56 are situated on the left-hand side of the alternator air box, as viewed in FIG. 7, and are collectively referred to herein as the LEFT BANK.

In the modular bridge assembly of this invention, each phase module includes the pair of power semiconductor devices connected to an individual alternator phase winding 10a-10c, 12a-12c. Thus, the LEFT BANK comprises three phase modules comprising the power semiconductor device pairs 18 and 20; 22 and 24; and 26 and 28. Similarly, the RIGHT BANK comprises three phase modules comprising the power semiconductor device pairs 38 and 40; 42 and 44; and 44 and 46.

Each transition module includes a single transition device. In the illustrated embodiment however, each of the transition devices 54 and 56, depicted in FIG. 1, is mechanized with a pair of devices connected in parallel, designated in FIG. 2 as 54, 54' and 56, 56'. Thus, the RIGHT BANK comprises two transition modules corresponding to the transition device 54, and the LEFT BANK comprises two transition modules corresponding to the transition device 56.

Figure 2:
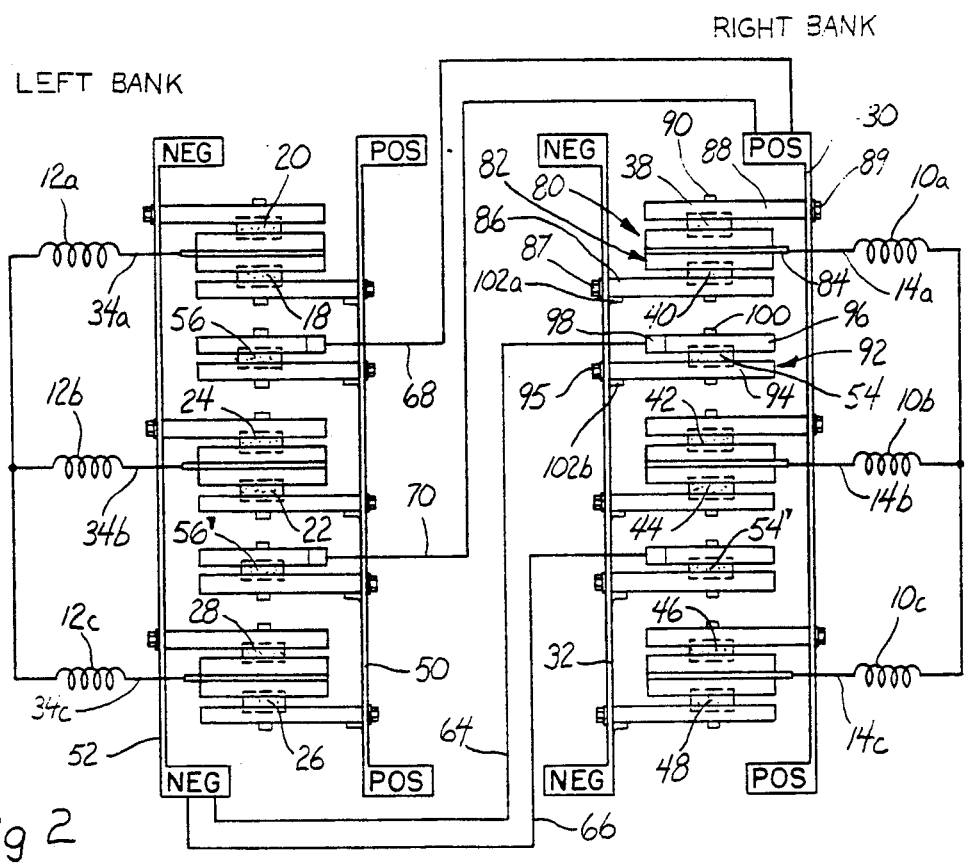
FIG. 2 is a schematic diagram of a modular power semiconductor assembly according to this invention for the transition alternator depicted in FIG. 1.

FIG. 2 schematically depicts the phase and transition modules arranged in RIGHT and LEFT BANKS, as described above. As indicated above, there are four transition devices 54, 54', 56 and 56'. The cables 64 and 66 couple the transition devices 54 and 54' to the negative rail 52, and the cables 68 and 70 connect the transition devices 56 and 56' to the positive rail 30. Otherwise, the reference numerals utilized in FIG. 1 have been repeated in FIG. 2. For symmetry and ease of wiring, the transition and phase modules are distributed as shown.

Each of the six phase modules, as seen in reference to exemplary phase module 80, comprises an inner heat sink 82 having an integral phase winding connecting plate 84, a first outer heat sink 86 secured to the negative DC rail 32 via bolts 87, and a second outer heat sink 88 secured to the positive DC rail 30 via bolts 89. The upper or high-side power semiconductor device 38 is sandwiched between the inner heat sink 82 and the second outer heat sink 88, while the lower or low-side device 40 device is sandwiched between the inner heat sink 82 and the first outer heat sink 86. A pair of bolts 90, 90' (only one shown in FIG. 2) passing through the heat sinks 82, 86 and 88 maintain the sandwiched power semiconductor devices 38, 40 in compression to ensure adequate electrical conductivity at the respective current carrying terminals.

Each of the four transition modules, as seen in reference to exemplary transition module 92, comprises a first heat sink 94 secured to the respective positive or negative DC rail 30, 32; 50, 52 via bolts 95 and a second heat sink 96 provided with an integral connection lug 98. The transition device 54 is sandwiched between the first and second heat sinks 94 and 96, and a pair of bolts 100, 100' (only one shown in FIG. 2) pass through the heat sinks 94 and 96 to maintain the sandwiched power semiconductor device 54 in compression to ensure adequate electrical conductivity at the respective current carrying terminals.

As indicated in FIG. 2, the phase and transition power semiconductor devices are partially recessed into the respective heat sinks to provide a more compact design than could otherwise be achieved. Nevertheless, the heat sinks contacting either side of a rectifier are separated by an adequately large air gap, as indicated.

Significantly, the schematic representation of FIG. 2 illustrates the staggered or offset relation of the outer heat sinks along a transverse axis perpendicular to the parallel DC rails 30, 32 and 50, 52. This feature, exaggerated in FIG. 2, permits simplified module installation and removal procedures, in that the modules are secured to the rails 30, 32, 50, 52 only by the fasteners necessary to assure adequate electrical contact between the respective module and rail. The same advantage is obtained with the transition modules, as indicated, due to the offset relation of its heat sinks.

Apart from the bolts 87, 89 and 95 which secure the various phase and transition modules to the DC rails 30, 32, 50 and 52, each module is physically supported by a guide member 102 formed on the inner longitudinal surfaces of the respective DC rails 30, 32, 50 and 52. With respect to exemplary phase module 80, the guide member 102a is formed on the inner surface of negative DC rail 32, and supports the phase module 80 via engagement with the outboard surface of first outer heat sink 86. With respect to exemplary transition module 92, the guide member 102b is formed on the inner surface of negative DC rail 32, and supports the transition module 92 via engagement with the outboard surface of first heat sink 94.

In supporting the phase and transition modules, the guide members 102a, 102b serve to facilitate module installation and removal, allowing the technician to slide individual modules into and out of position between the respective DC rails. In the illustrated embodiment, the guide members 102 are integral with the respective DC rails 30, 32, 50, 52, and are formed by suitably punching and deforming the respective rails in relation to the respective bolt openings.

Figure 5:
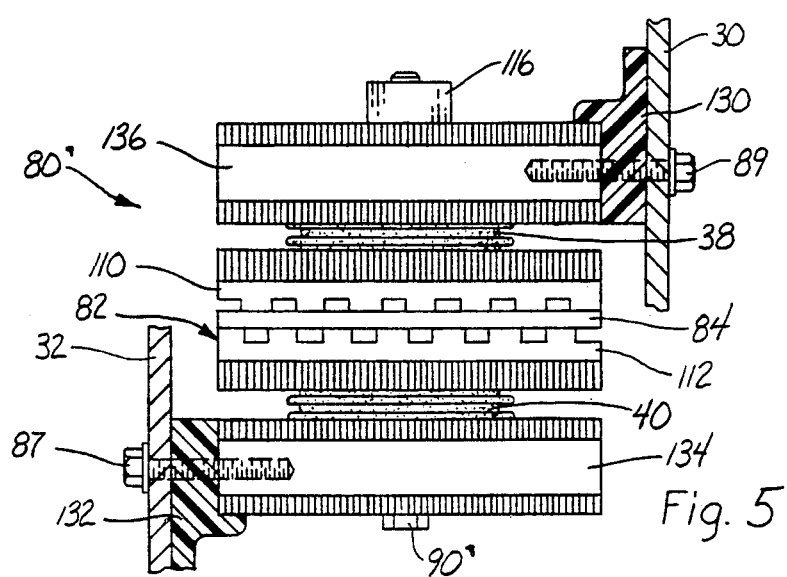
FIGS. 5 and 6 are sectional views of phase and transition modules, respectively, corresponding to those schematically depicted in FIG. 2, according to a second embodiment of this invention.
Figure 6:
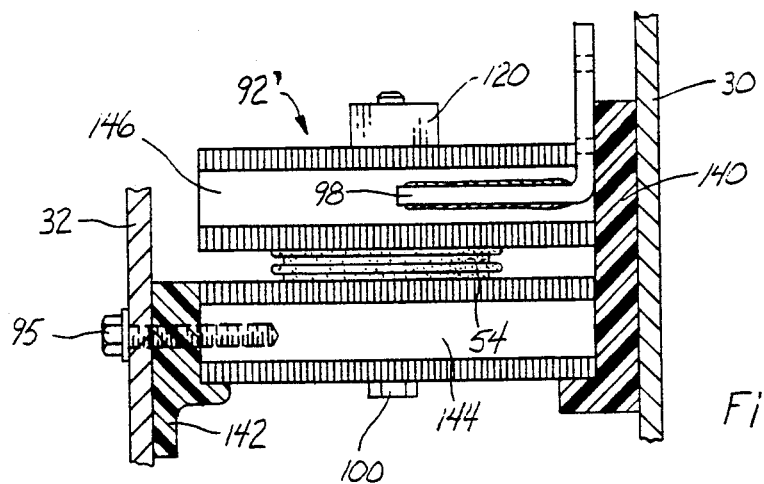

As indicated above, FIGS. 3a-3b and 4a-4b depict phase and transition modules, respectively, according to the first embodiment of this invention. FIGS. 5 and 6 depict phase and transition modules, respectively, according to a second embodiment of this invention in which modules are supported by insulating guide members. In both embodiments, the reference numerals used in FIGS. 1-2 have been repeated where appropriate.

Figure 3A:
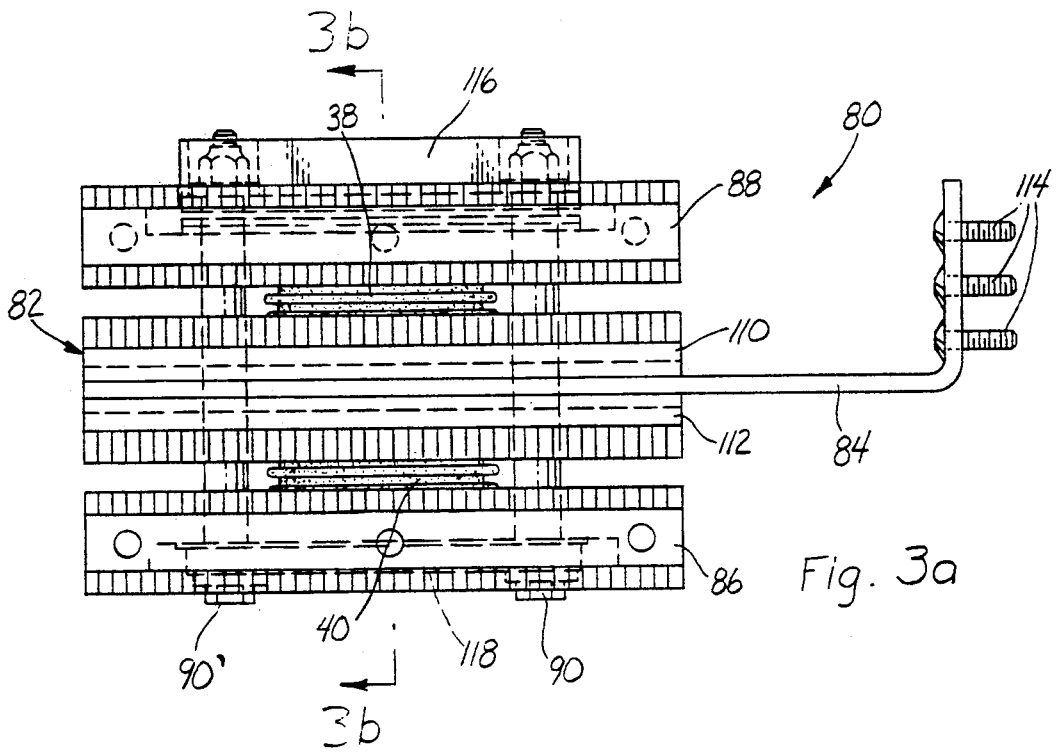
FIGS. 3a–3b and 4a–4b are sectional views of phase and transition modules, respectively, corresponding to those schematically depicted in FIG. 2, according to a first embodiment of this invention.
Figure 3B:
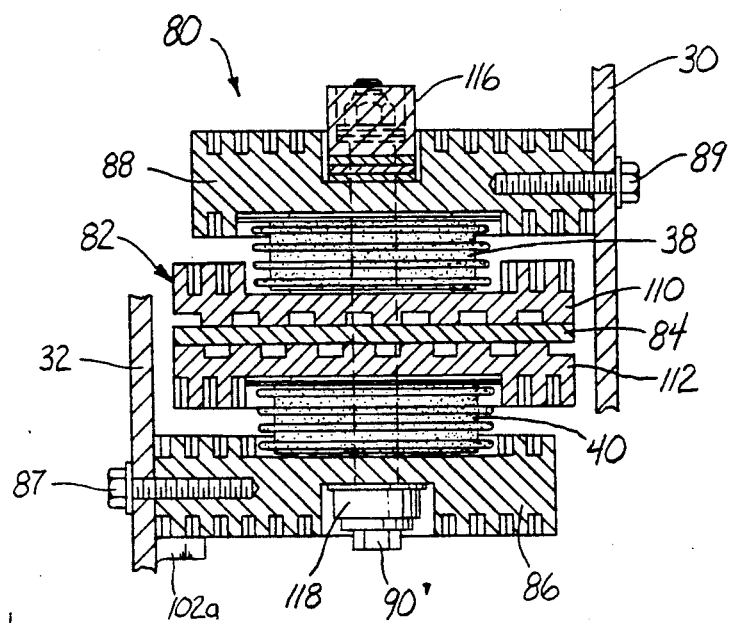

Referring to the sectional views of the phase module 80 in FIGS. 3a and 3b, it will be seen that the inner heat sink 82 of each module actually comprises two heat sinks 110 and 112 oppositely disposed about the connecting plate 84. Stud bolts 114 welded on the outboard end of plate 84 are provided for attachment of the alternator phase winding cables. Also, both of the bolts 90 and 90' are shown in FIG. 3a. The bolts 90, 90' are tightened against upper and lower clamping blocks 116 and 118 to distribute the compression forces. FIG. 3b illustrates the phase module 80 installed between the positive and negative DC rails 30 and 32.

The illustrated heat sinks are formed of machined or die-cast aluminum having a diamond fin pattern which permits relatively high air flow for improved cooling capability. However, other heat sink designs may suffice, so long as the heat transfer characteristics provide adequate cooling of the disk type semiconductor devices.

Figure 4A:
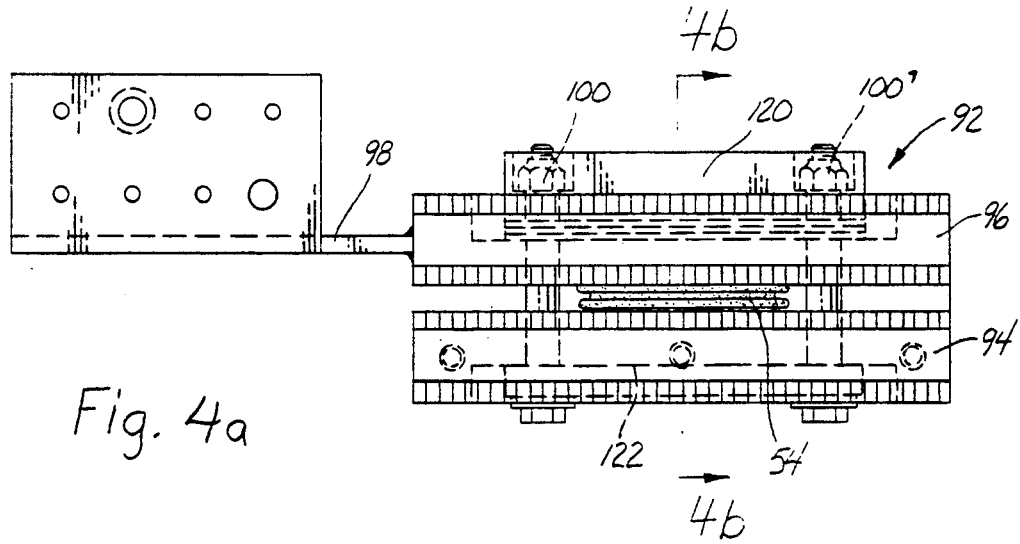
Figure 4B:
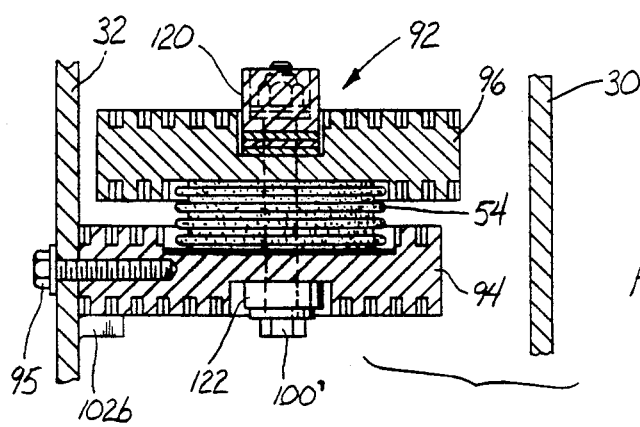

Referring to the sectional views of transition module 92 in FIGS. 4a and 4b, it will be seen that the connecting lug 98 is welded onto an outboard surface of heat sink 96 and extends rearward of the alternator to facilitate attachment of the cable 64. Also, both of the bolts 100 and 100' are shown in FIG. 4a. As with the phase module 80 of FIGS. 3a-3b, the transition module bolts 100, 100' are tightened against upper and lower clamping blocks 120, 122 to distribute the compression forces. FIG. 4b illustrates the transition module 92 as installed between the positive and negative DC rails 30 and 32.

As indicated above, FIGS. 5 and 6 depict sectional views according to a second embodiment of this invention in which the phase and transition modules (designated by the reference numerals 80' and 92') are each supported by a pair of insulator blocks secured to inner surfaces of the positive and negative DC rails 30, 32, 50, 52. Reference numerals used in FIGS. 1-4 have been applied where appropriate. Where required, electrical contact between the heat sinks and DC rails is made via connecting bolts. With this arrangement, the staggered relationship of the heat sinks is achieved with the insulating blocks, permitting increased uniformity in the manufacture of the upper and lower heat sinks.

Referring to FIG. 5, the phase module 80' is supported between positive and negative DC rails 30 and 32 by upper and lower blocks 130 and 132. The block 130 is secured to the rail 30 and the block 132 is likewise secured to the rail 32. The phase module 80' comprises an inner heat sink 82 identical to that of the phase module 80, and first and second outer heat sinks 134 and 136 corresponding to the heat sinks 86 and 88 of the phase module 80.

As with the phase module 80, the heat sinks 82, 134 and 136 are mutually secured in contact with the power semiconductor devices 38 and 40 via bolts 90 and 90' which are tightened against upper and lower clamping block 116. Electrical contact between first outer heat sink 134 and negative DC rail 32 is achieved via bolts 87, and electrical contact between second outer heat sink 136 and positive DC rail 30 is achieved via bolts 89. Although blocks 130 and 132 are depicted as electrical insulators, conductive material may be used as well. Significantly, heat sinks 134 and 136 are identical, permitting reduced manufacturing costs and improved reliability of module assembly.

Referring to FIG. 6, the transition module 92' is supported between positive and negative DC rails 30 and 32 by blocks 140 and 142. The block 140 is secured to the rail 30 and the block 142 is likewise secured to the rail 32. The transition module 92' comprises first and second heat sinks 144 and 146 corresponding to the heat sinks 94 and 96 of the transition module 92. As with the transition module 92, the connecting lug 98 is welded onto an outboard surface of heat sink 146 so as to extend rearward of the alternator to facilitate attachment of the cable 64. Electrical contact between first heat sink 144 and negative DC rail 32 is achieved via bolts 95. Although block 142 is depicted as an electrical insulator, conductive material may be used as well. As with the transition module 92, the heat sinks 144 and 146 are mutually secured in contact with the power semiconductor device 54 via bolts 100 and 100' which are tightened against lower clamping block 120.

Figure 7A:
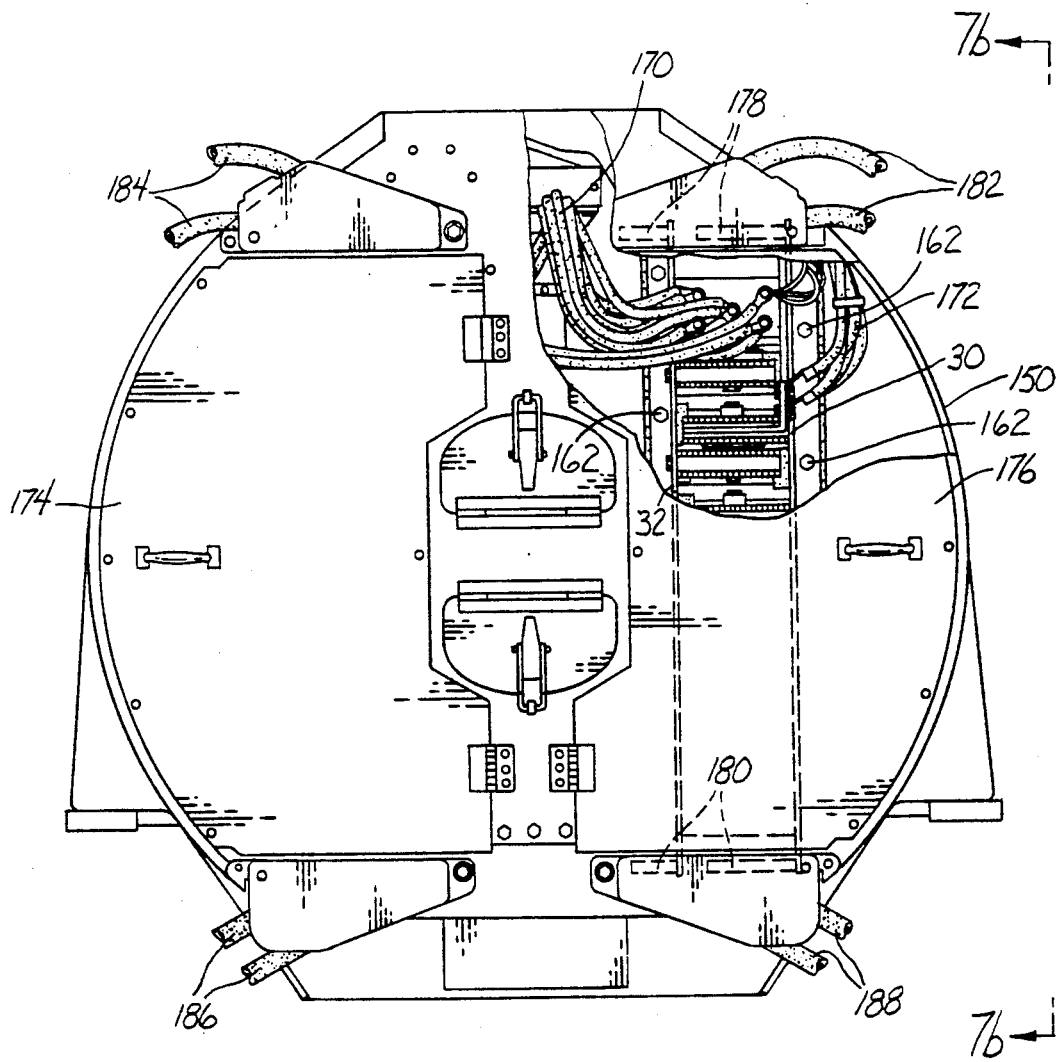
FIG. 7a and 7b are views of the air box of an alternator equipped with a modular power semiconductor assembly according to the first embodiment of this invention.
Figure 7B:
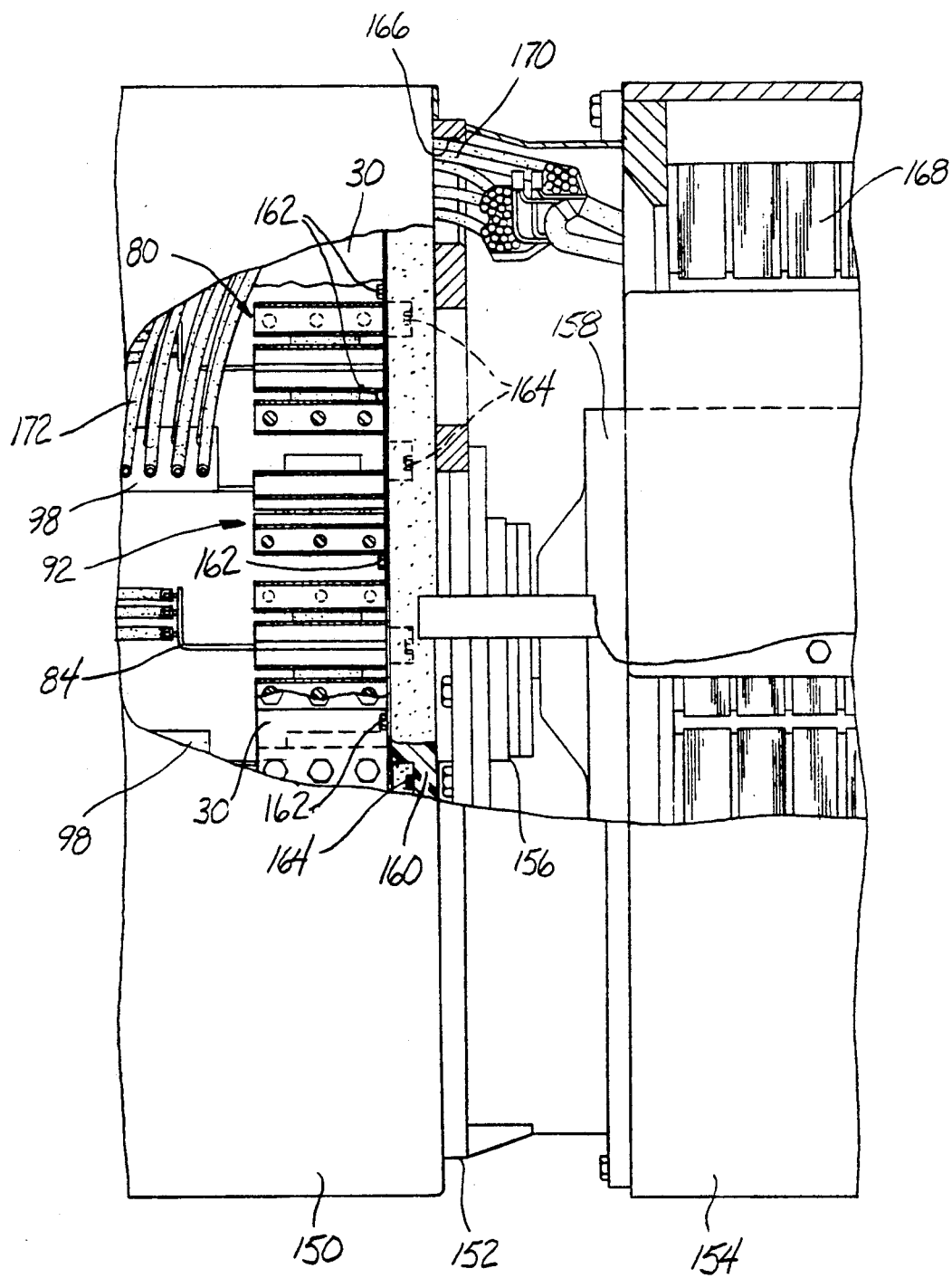

FIGS. 7a-7b show the modular bridge assembly according to the first embodiment of this invention in an actual transition alternator application. FIG. 7a is a view of the alternator from the rear of the assembly, depicting a partial view of the installed phase and transition modules, while FIG. 7b is a partial side view of the assembly depicted in FIG. 7a.

Referring particularly to FIG. 7b, the bridge assembly of this invention is installed in an air box enclosure mounted on the end frame 152 of alternator 154. The end frame 152 also supports a bearing assembly 156 for the alternator rotor 158. The DC rails 30, 32, 50 and 52 are secured to the face of end frame 152 on vertical insulator members (such as the illustrated member 160) via bolts 162 and 164. Openings (such as the opening 166) are provided in the face of end frame 152 behind each of the phase and transition modules 80, 92 for permitting air cooling of the modules via the ventilating air used to cool the rotor 154 and stator 168 of alternator 154.

The alternator phase winding leads 170 (corresponding to the lines 14a-14c and 34a-34c of FIG. 1) are routed through various openings in end frame 152 for connection to the various phase module connection plates 84, as indicated in FIG. 7a. Cables 172 corresponding to the schematically depicted cables 64, 66, 68 and 70 of FIG. 2 interconnect the various transition modules via the connection lugs 98. As best viewed in FIG. 7a, a pair of service doors 174, 176 form a closure for the air box 150, providing access to upper and lower DC bus bars 178, 180 via cables 182-188.

While this invention has been illustrated in reference to the illustrated embodiment, it is expected that various modifications will occur to those skilled in the art, and that modular power semiconductor assemblies incorporating such modifications may fall within the scope of this invention which is defined by the appended claims.

The embodiments of the invention in which an exclusive property or privilege is claimed are defined as follows:

1. A modular power semiconductor assembly in a transition alternator having first and second sets of phase windings, the semiconductor bridge assembly comprising:

first and second pairs of elongate DC bus bars, the bus bars of each such pair being supported in substantially parallel spaced relationship to define a cavity therebetween having a longitudinal axis substantially parallel to such bus bars and a transverse axis substantially perpendicular to such bus bars;

bridge means interconnecting said first and second sets of phase windings to said first and second pairs of DC bus bars including multiple pairs of disk-shaped power semiconductor bridge devices associated with each of said pairs of bus bars, multiple inner heat sinks, and multiple outer heat sinks, each pair of bridge devices being separated by an inner heat sink and sandwiched between first and second outer heat sinks to defined multiple phase modules individually fastened between said first and second bus bars, the fastened modules having a mutual longitudinal axis which substantially coincides with the longitudinal axes of said cavities, the inner heat sinks being electrically connected to individual phase windings of said alternator, and the first and second outer heat sinks of each such module being staggered along the transverse axes of said cavities so that each first outer heat sink engages one bus bar of the associated bus bar pair, and each second outer heat sink engages the other bus bar of said associated bus bar pair; and transition means interconnecting said first and second pairs of bus bars, selectively in series or parallel, including at least one power semiconductor transition device associated with each pair of bus bars, each such transition device being sandwiched between first and second transition heat sinks to define first and second transition modules individually fastened between said first and second pairs of bus bars, the fastened modules having a longitudinal axis which substantially coincides with the longitudinal axes of a respective cavity, the first transition heat sink of each module being physically and electrically connected to a bus bar of associated pair of bus bars, and the second transition heat sink being electrically connected to a bus bar of the other pair of bus bars, the first and second transition heat sinks of each such transition module being staggered along said transverse axes so as to electrically isolate the second transition heat sink from the bus bars of said associated pair of bus bars upon such connection of said first transition heat sink.

2. A modular power semiconductor assembly in a multiple phase alternator with phase windings comprising:

first and second elongate DC bus bars supported in substantially parallel spaced relationship to define a cavity therebetween having a longitudinal axis substantially parallel to said bus bars and a transverse axis substantially perpendicular to said bus bars; and means interconnecting multiple phase windings of said alternator to said DC bus bars including multiple pairs of disk-shaped power semiconductor devices, multiple inner heat sink means, and multiple outer heat sink means, each pair of semiconductor devices being separated by an inner heat sink means and sandwiched between first and second outer heat sink means to define multiple phase modules individually fastened between said first and second bus bars, the fastened modules having a mutual longitudinal axis which substantially coincides with the longitudinal axis of said cavity, the inner heat sink means being electrically connected to individual phases of said alternator, and the first and second outer heat sink means of each such module being staggered along the transverse axis of said cavity so that each first outer heat sink means engages and is fastened to said first bus bar, and each second outer heat sink means engages and is fastened to said second bus bar.

3. The combination set forth in claim 2, including:

means mutually securing the inner and outer heat sink means of each of said phase modules to maintain the respective pairs of power semiconductor devices in compression therebetween.

4. The combination set forth in claim 2, including:

support means formed on inner surfaces of said bus bars along axes perpendicular to said transverse and longitudinal axes supporting respective phase modules within said cavity during fastening of said outer heat sink means to said bus bars.

5. The combination set forth in claim 2, wherein:

the outer heat sink means of each phase module includes a heat sink element secured to said module and a spacer element secured to one of said bus bars.

6. A modular power semiconductor assembly in a transition alternator having first and second sets of phase windings, the semiconductor bridge assembly comprising:

first and second sets of elongate DC bus bars, the bus bars of each such set being supported in substantially parallel spaced relationship to define a cavity therebetween having a longitudinal axis substantially parallel to such bus bars and a transverse axis substantially perpendicular to such bus bars;

means interconnecting said first and second sets of phase windings to said first and second sets of DC bus bars; and means interconnecting said first and second sets of bus bars, selectively in series or parallel, including at least one power semiconductor device associated with each set of bus bars, each such device being sandwiched between first and second transition heat sinks to define first and second transition modules individually fastened between said first and second sets of bus bars, the fastened modules having a longitudinal axis which substantially coincides with the longitudinal axes of a respective cavity, the first transition heat sink of each module being physically and electrically connected to a bus bar of the associated set, and the second transition heat sink being electrically connected to a bus bar of the other set, the first and second transition heat sinks of each such transition module being staggered along said transverse axes so as to electrically isolate the second transition heat sink from the bus bars of said associated set upon such connection of said first transition heat sink.

7. The combination set forth in claim 6, including:

means mutually securing the first and second transition heat sinks of each of said transition modules to maintain the respective power semiconductor device in compression therebetween.

8. The combination set forth in claim 6, including:

support means formed on inner surfaces of said bus bars along axes perpendicular to said transverse and longitudinal axes supporting said transition modules within said cavities during fastening of said first heat sink to said bus bars.

9. The combination set forth in claim 6, wherein:

the first heat sink means of each transition module includes a heat sink element secured to said module and a spacer element secured to a bus bar to which such module is connected.

* * * * *